United States Patent
Son et al.

(10) Patent No.: US 8,030,679 B2
(45) Date of Patent: Oct. 4, 2011

(54) NITRIDE SEMICONDUCTOR LIGHT EMITTING DEVICE AND FABRICATION METHOD THEREFOR

(75) Inventors: Hyo Kun Son, Gwangjoo-si (KR); Suk Hun Lee, Gwangjoo-si (KR)

(73) Assignee: LG Innotek Co., Ltd., Seoul (KR)

( * ) Notice: Subject to any disclaimer, the term of this patent is extended or adjusted under 35 U.S.C. 154(b) by 533 days.

(21) Appl. No.: 11/577,528

(22) PCT Filed: Oct. 6, 2005

(86) PCT No.: PCT/KR2005/003310
§ 371 (c)(1),
(2), (4) Date: Apr. 19, 2007

(87) PCT Pub. No.: WO2006/080701
PCT Pub. Date: Aug. 3, 2006

(65) Prior Publication Data
US 2009/0072252 A1    Mar. 19, 2009

(30) Foreign Application Priority Data
Oct. 19, 2004  (KR) .............. 10-2004-0083576

(51) Int. Cl.
*H01L 33/00* (2010.01)
*H01L 21/00* (2006.01)

(52) U.S. Cl. ............... 257/101; 257/103; 257/E33.025; 257/E33.03; 257/E21.097; 438/47; 438/94

(58) Field of Classification Search .......... 257/94, 257/E33.023, E21.09, 101, 103, E21.097, 257/E33.025, E33.03; 438/47, 94
See application file for complete search history.

(56) References Cited

U.S. PATENT DOCUMENTS

| | | | |
|---|---|---|---|
| 6,534,797 B1 * | 3/2003 | Edmond et al. ............... | 257/97 |
| 2001/0038484 A1 * | 11/2001 | Harada .................... | 359/204 |
| 2003/0205717 A1 * | 11/2003 | Khare et al. ............... | 257/103 |
| 2004/0072383 A1 * | 4/2004 | Nagahama et al. ........... | 438/47 |
| 2006/0081861 A1 * | 4/2006 | Wu et al. .................. | 257/97 |

FOREIGN PATENT DOCUMENTS

JP      7302929      11/1995
(Continued)

OTHER PUBLICATIONS

Wu et al.—InGaN/GaN LEDs with a Si-Doped InGaN/GaN Short-Period Superlattice Tunneling Contact Layer, Journal of Electronic Materials, Vol. 32, No. 5, May 2003.* Office Action dated Jun. 27, 2008 in Chinese Application No. 200580035544.0, filed Oct. 6, 2005.

*Primary Examiner* — Zandra Smith
*Assistant Examiner* — Jeremy Joy
(74) *Attorney, Agent, or Firm* — Saliwanchik, Lloyd & Eisenschenk (57) ABSTRACT

Disclosed is a nitride semiconductor light emitting device including: one or more AlInN layers; an In-doped nitride semiconductor layer formed above the AlInN layers; a first electrode contact layer formed above the In-doped nitride semiconductor layer; an active layer formed above the first electrode contact layer; and a p-type nitride semiconductor layer formed above the active layer. According to the nitride semiconductor light emitting device, a crystal defect of the active layer is suppressed, so that the reliability of the nitride semiconductor light emitting device is increased and the light output is enhanced.

28 Claims, 4 Drawing Sheets

| Layer | Ref. |
|---|---|
| Super grading n-InGaN layer | 37 |
| p-GaN layer | 35 |
| Active layer | 33 |
| n-GaN layer | 63 |
| n-GaN layer | 31 |
| In-doped GaN layer | 29 |
| InGaN layer | 61 |
| 2nd AlInN layer | 27 |
| 1st AlInN layer | 25 |
| Buffer layer | 23 |
| Substrate | 21 |

FOREIGN PATENT DOCUMENTS

| | | | |
|---|---|---|---|
| JP | 2003178976 | | 6/2003 |
| JP | 2003178976 A | * | 6/2003 |
| WO | WO 2004/017431 | | 2/2004 |
| WO | WO 2004/017432 | | 2/2004 |
| WO | WO 2004017431 A1 | * | 2/2004 |
| WO | WO 2004017432 A1 | * | 2/2004 |
| WO | WO 2004/114421 | | 12/2004 |

* cited by examiner

| |  |
|---|---|
| Super grading n-InGaN layer | 37 |
| p-GaN layer | 35 |
| Active layer | 33 |
| n-GaN layer | 63 |
| n-GaN layer | 31 |
| In-doped GaN layer | 29 |
| InGaN layer | 61 |
| 2nd AlInN layer | 27 |
| 1st AlInN layer | 25 |
| Buffer layer | 23 |
| Substrate | 21 |

[Figure 8]

NITRIDE SEMICONDUCTOR LIGHT EMITTING DEVICE AND FABRICATION METHOD THEREFOR

CROSS-REFERENCE TO RELATED APPLICATION

This application is the U.S. national stage application of International Patent Application No. PCT/KR2005/003310, filed Oct. 6, 2005, the disclosure of which is hereby incorporated by reference in its entirety, including all figures, tables and amino acid or nucleic acid sequences.

TECHNICAL FIELD

The present invention relates to a nitride semiconductor light emitting device and fabrication method therefor, and particularly, to a nitride semiconductor light emitting device and fabrication method therefor in which crystal defects of the nitride semiconductor light emitting device are suppressed, electrical properties are improved and light emitting efficiency is enhanced.

BACKGROUND ART

In general, GaN-based semiconductors are applied to fields of light devices, such as blue/green light emitting device (LED), high speed switching elements, such as MESFET (Metal Semiconductor Field Effect Transistor), HEMT(High Electron Mobility Transistors) and the like, and electronic devices as high power devices.

In the general types of the GaN-based semiconductor LEDs, the GaN-based semiconductor LED is fabricated by a method including growing a thin polycrystalline film as a buffer layer on a substrate (e.g., sapphire substrate or SiC substrate) at a low growth temperature, forming an n-GaN layer on the buffer layer at a high growth temperature, and forming a magnesium (Mg)-doped p-GaN layer on the buffer layer. An active layer emitting light is sandwiched between the n-GaN layer and the p-GaN layer.

Meanwhile, in the conventional pn-junction LED and fabrication method thereof, crystal defects may be generated due to a difference in lattice constant and a difference in thermal expansion coefficient between the sapphire substrate and the GaN semiconductor. To suppress the occurrence of such crystal defects, a low temperature GaN-based or AlN-based buffer layer is applied, obtaining a GaN semiconductor having a crystal defect size of ~$10^8/cm^1$. Hereinafter, the occurrence path of the crystal defect and the conventional method employed to suppress the crystal defect will be described.

In brief, if amorphous GaN-based or AlN-based buffer layer is formed at a low temperature and is then recrystallized at a high temperature, a 'poly-like' crystal is formed, which is very rough in surface state and is not good in flatness. However, as the crystal growth continues, a vertical growth is preferrentially performed at a first stage and then two-dimensional growth is preferrentially performed at a second stage, so that good quality of nitride semiconductor can be obtained.

At this time, in the vertical growth period corresponding to the initial growth phase, the crystal defect is generated at a boundary fused with a GaN island. The crystal defects are generated in a variety of forms, for example, 'threading dislocation', 'screw dislocation', 'line dislocation', 'point defect' that are propagated to a surface of the LED, or 'mixture' of the aforementioned defects. Eventually, the crystal defects badly influence the device reliability. In particular, while the 'threading dislocation' is propagated to the surface of the LED from the sapphire substrate, it passes through the active layer emitting light. In the future, the 'threading dislocation' serves as a current path of leakage current or the like, and accordingly, when a high voltage such as ESD is instantly applied to, the active layer is destroyed or light power is lowered, which serves as a basic reason badly influencing the reliability.

Under this circumstance, to further enhance the light power of the LED and the operation reliability against an external factor such as ESD (electrostatic discharge) or the like, the growth of a GaN semiconductor having less crystal defect is required.

To solve this problem; a variety of growth techniques, such as 'lateral overgrowth', 'pendeo-growth' or the like using insulator or refractory metal have been employed to decrease the crystal defect to ~$10^7/cm^1$ at most. However, the conventional fabrication method has a problem that the process is complicated. Also, although the conventional fabrication method can effectively suppress the crystal defect, it is disadvantageous in terms of costs and still has the need to continue technical development in order to meet the possibility of mass production.

Accordingly, in order to effectively enhance the light power and reliability of the LED, a crystal growth method that can minimize the crystal defect propagated from the substrate is essentially required.

DISCLOSURE

Technical Problem

The present invention is provided to substantially obviate one or more problems due to limitation and disadvantages of the conventional art, and it is an object of the present invention to provide a nitride semiconductor LED and fabrication method therefor that can enhance the crystallinity of the active layer constituting the nitride semiconductor LED, the light power and the reliability.

Technical Solution

To accomplish the above object, there is provided a nitride semiconductor light emitting device including: one or more AlInN layers; an In-doped nitride semiconductor layer formed above the AlInN layers; a first electrode contact layer formed above the In-doped nitride semiconductor layer; an active layer formed above the first electrode contact layer; and a p-type nitride semiconductor layer formed above the active layer.

In another aspect of the present invention, there is provided a nitride semiconductor light emitting device including: a superlattice layer having one selected from the group consisting of an InGaN/InGaN superlattice structure, an InGaN/GaN superlattice structure, an InGaN/AlGaN superlattice structure, and an InGaN/AlInGaN superlattice structure; an In-doped nitride semiconductor layer formed above the superlattice layer; a first electrode contact layer formed above the In-doped nitride semiconductor layer; an active layer formed above the first electrode contact layer; and a p-type nitride semiconductor layer formed above the active layer.

In another aspect of the present invention, there is provided a method of fabricating a nitride semiconductor light emitting device, the method including the steps of: forming a buffer layer above a substrate; forming one or more AlInN layers above the buffer layer; forming an In-doped nitride semiconductor layer above the AlInN layers; forming a first electrode contact layer above the In-doped nitride semiconductor layer;

forming an active layer above the first electrode contact layer; and forming a p-type nitride semiconductor layer above the active layer. in another aspect of the present invention, there is provided a method of fabricating a nitride semiconductor light emitting device, the method including the steps of: forming a buffer layer above a substrate; forming a superlattice layer above the buffer layer, the superlattice layer having one selected from the group consisting of an InGaN/InGaN superlattice structure, an InGaN/GaN superlattice structure, an InGaN/AlGaN superlattice structure, and an InGaN/AlInGaN superlattice structure; forming an In-doped nitride semiconductor layer above the superlattice layer; forming a first electrode contact layer above the In-doped nitride semiconductor layer; forming an active layer above the first electrode contact layer; and forming a p-type nitride semiconductor layer above the active layer.

In another aspect of the present invention, there is provided a nitride semiconductor light emitting device including: a strain control layer provided in two or more AlInN layers or a superlattice layer; an In-doped formed above the strain control layer; a first electrode contact layer formed above the In-doped nitride layer; an active layer formed above the first electrode contact layer; and a p-type nitride semiconductor layer formed above the active layer.

Advantageous Effects

According to the present invention provided, the crystallinity of the active layer constituting the nitride semiconductor LED can be enhanced and the light power and reliability of the LED can be enhanced.

DESCRIPTION OF DRAWINGS

The spirit of the present invention will be understood more apparently from the accompanying drawings. In the drawings.

BEST MODE

Hereinafter, embodiments of the present invention will be described with reference to the accompanying drawings.

First Embodiment

Figure 1:
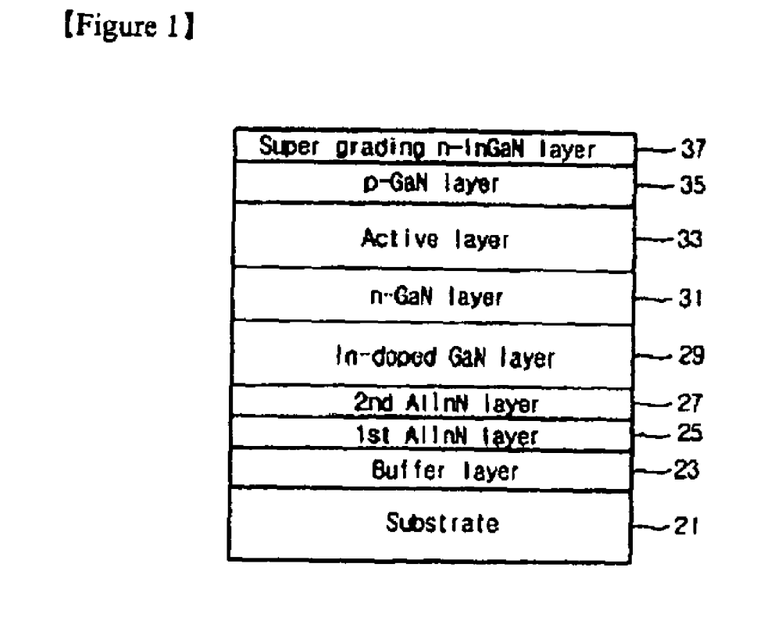
FIG. 1 is a schematic view of a stack structure of a nitride semiconductor LED according to a first embodiment of the present invention.

FIG. 1 is a schematic view of a stack structure of a nitride semiconductor LED according to a first embodiment of the present invention.

Referring to FIG. 1, the nitride semiconductor LED of the present invention includes a substrate 21 and a buffer layer 23 formed on the substrate 21. The substrate 21 may be a sapphire substrate or a SiC substrate. The buffer layer 23 may have a stack structure of AlInN/GaN/AlInN/GaN or of $Al_xIn_yGa_{1-x-y}N/In_zGa_{1-z}N/GaN$.

Also, two or more AlInN layers are formed on the buffer layer 23. In FIG. 1, there is shown an example that a first AlInN layer 25 and a second AlInN layer 27 are formed. In a fabrication method of the nitride semiconductor LED according to the present invention, an amorphous AlInN-based buffer layer 23 is grown on the substrate 21 at a low growth temperature, and is then recrystallized at a high growth temperature. Thereafter, the growth temperature is lowered and then is again gradually elevated as the stage proceeds, thereby growing the first AlInN layer 25 and the second AlInN layer 27.

Also, the nitride semiconductor LED according to the present invention includes an In-doped GaN layer 29 formed on the second AlInN layer 27, and a first electrode contact layer formed on the In-doped GaN layer 29. An n-GaN layer, an example of the first electrode contact layer 31, is shown in FIG. 1. In addition, in the fabrication method, the growth temperature is again elevated to grow an In-doped GaN layer 29 and a nitride semiconductor layer co-doped with silicon (Si) and indium (In) as the n-GaN layer 31 that is the first electrode contact layer.

Also, the nitride semiconductor LED according to the present invention includes an active layer 33 formed on the n-GaN layer 31 that is the first electrode contact layer, and a p-GaN layer 35 formed on the active layer 33. The active layer 33 which emits light of a desired wavelength band may be formed in a single quantum well or multi quantum well having $In_xGa_{1-x}N/In_yGa_{1-y}N$ structure having well layer/barrier layer as one period. The p-GaN layer 35 is grown on the active layer 33 by elevating the growth temperature.

Thereafter, a second electrode contact layer is formed on the p-GaN layer 35. In FIG. 1, as one example, a super grading n-$In_xGa_{1-x}N$ layer 37 having a structure in which the content of In is sequentially controlled such that the energy band gap is adjusted is grown.

Meanwhile, a transparent electrode for applying an electric power is formed in the second electrode contact layer of the npn-junction LED having the aforementioned construction. Material for this transparent electrode is determined by a doping phase of the GaN-based semiconductor formed or a difference in energy band gap. Since the LED has the super grading structure in which the content of In is linearly varied to control the energy band gap in order to increase the current injection effect, the material for the transparent electrode can be selected from the following materials.

In other words, the transparent electrode can be formed of one selected from the group consisting of a light transmissive metal oxide, such as ITO(In-SnO), IZO(In-ZnO), ZGO(Ga-ZnO), AZO(Al-ZnO), IGZO(In-Ga ZnO), AGZO(Al-Ga ZnO), ZnO, IrOx, and RuOx, and a light transmissive resistance metal, such as Au alloy containing Ni metal.

The nitride semiconductor LED having the aforementioned construction can be enhanced 30-50% in light power compared with the conventional nitride semiconductor LED, and can be also enhanced in reliability.

Hereinafter, features of the nitride semiconductor LED according to the above embodiment will be described in more detail.

In the present embodiment, the first AlInN layer 25 and the second AlInN layer 27 are formed between the low temperature buffer layer 23 and the high temperature GaN-based semiconductor layers 29, 31 by varying the growth temperature as the stage proceeds. By doing so, the occurrence of crystal defect in the GaN-based semiconductor layers 29, 31 can be effectively suppressed to enhance the performance of the LED, which is one characteristic of the present invention.

A mechanism that the AlInN layers 25 and 27 suppress the occurrence of the crystal defect in the GaN-based semiconductor layers 29, 31 will be described in more detail.

First, the buffer layer 23 is recrystallized at a high growth temperature in order to grow the GaN-based semiconductor, so that the buffer layer is transformed from an amorphous phase to a polycrystalline phase. The GaN semiconductor grown on the buffer layer experiencing the phase transformation achieves the crystal growth through a fusion between islands. At this time, according to the thickness varied with the growth temperature of the buffer layer, types of its phase transformation are changed during the high temperature recrystallization, so that a difference in strain and flatness of the surface is generated. The initial growth mode of the GaN-based semiconductor is determined by the above difference. In the initial growth mode of the GaN-based semiconductor, a vertical growth mode is preferentially performed during the fusion of islands, and as the thickness increases, a horizontal growth mode is preferentially performed.

As aforementioned, during the fusion of the initial islands, the vertical growth mode is preferentially performed. At this time, a crystal defect, such as 'threading dislocation' is generated at a boundary of the fusion and it passes through the active layer and proceeds to a surface of the LED. To effectively suppress and decrease the initial crystal defect, the buffer layer of the present invention is recrystallized at a high temperature and two or more AlInN semiconductor layers as a strain control layer are grown by linearly varying the growth temperature within the growth temperature range higher than that of the buffer layer. As a result, the surface of the buffer layer having the low level of flatness and rough polycrystalline phase can be improved, and a stress of the GaN-based semiconductor subject to a 'tensile strain' can be suppressed to thereby grow the GaN-based semiconductor LED having a good quality of crystal phase.

The characteristics of the inventive nitride semiconductor LED fabricated by the aforementioned fabrication method will be described in detail with reference to FIGS. 2 to 5.

Figure 2:
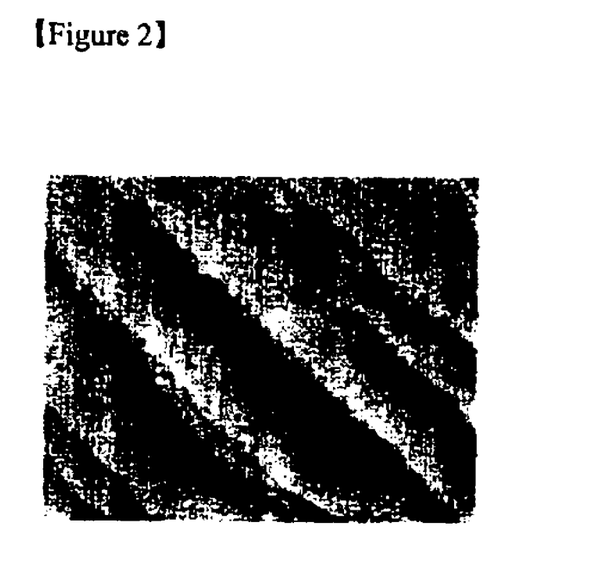
FIGS. 2 and 3 are AFM (Atomic Force Microscope) surface photographs of a nitride semiconductor grown by the conventional art.
Figure 3:
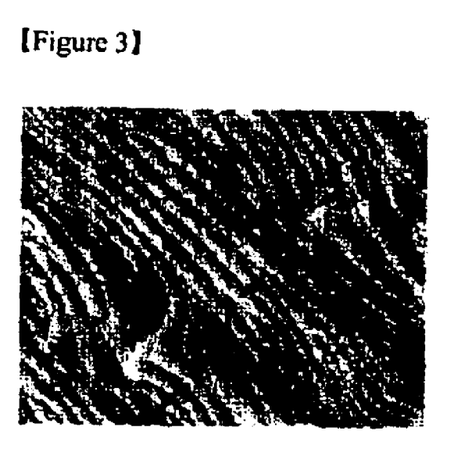
Figure 4:
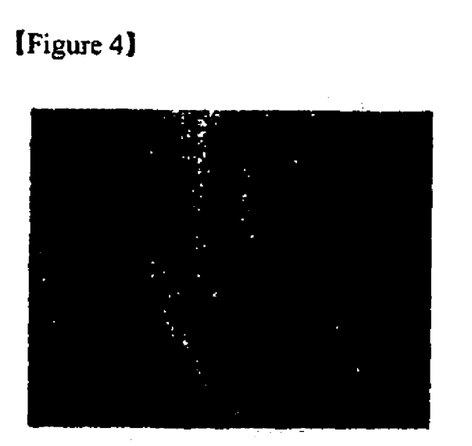
FIGS. 4 and 5 AFM surface photographs of a nitride semiconductor grown by a method of fabricating the nitride semiconductor according to the present invention.
Figure 5:
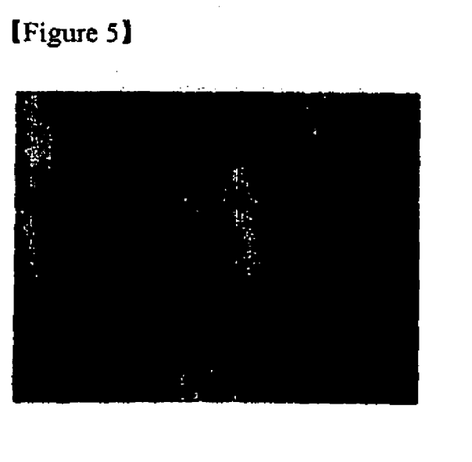

FIGS. 2 and 3 are AFM (Atomic Force Microscope) surface photographs of a nitride semiconductor grown by the conventional art, and FIGS. 4 and 5 AFM surface photographs of a nitride semiconductor grown by a method of fabricating the nitride semiconductor according to the present invention. In the above AFM surface photographs, FIGS. 2 and 4 are surface photographs of an area of 1 μm×1 μm and FIGS. 3 and 5 are surface photographs of an area of 5 μm×5 μm. Also, in the case of the present embodiment, the sapphire substrate and AlInN/GaN/AlInN/GaN buffer layer are applied, the first AlInN layer and the second AlInN layer are formed on the buffer layer by varying their growth temperature according to the growth stages, and the In-doped GaN layer is formed on the second AlInN layer.

Referring to FIGS. 2 and 3, the surfaces of the GaN semiconductor grown by the conventional fabrication method have a terrace shape divided by a number of 'dislocation' defects and 'pits'. Also, as seen from the dark spots, it is known that the growth of the GaN semiconductor is ended by 'threading dislocation' that is one of the screw dislocations. However, as shown in FIGS. 4 and 5, the nitride semiconductor grown by the fabrication method of the present invention is grown with dislocations and pits greatly decreased in their number compared with those of the conventional art, having a uniform terrace form.

Also, it can be confirmed that the nitride semiconductor grown by the fabrication method of the present embodiment has a surface flatness of approximately 1.8 Å, which corresponds to a greatly enhanced value compared with the conventional surface flatness, 2.7 Å.

In addition, in evaluation of electrical properties of the nitride semiconductor grown by the fabrication method of the present embodiment, it is seen that the mobility is increased by two times or more at room temperature from 250 $cm^1$/Vsec to 500 $cm^1$/Vsec. The enhancement of the electrical property corresponds with the surface analysis of the AFM. From the above result, it can be confirmed that the AlInN layer grown with the gradual variation of the growth temperature has effectively suppressed the occurrence of the crystal defect in the AlInN layer.

Figure 6:
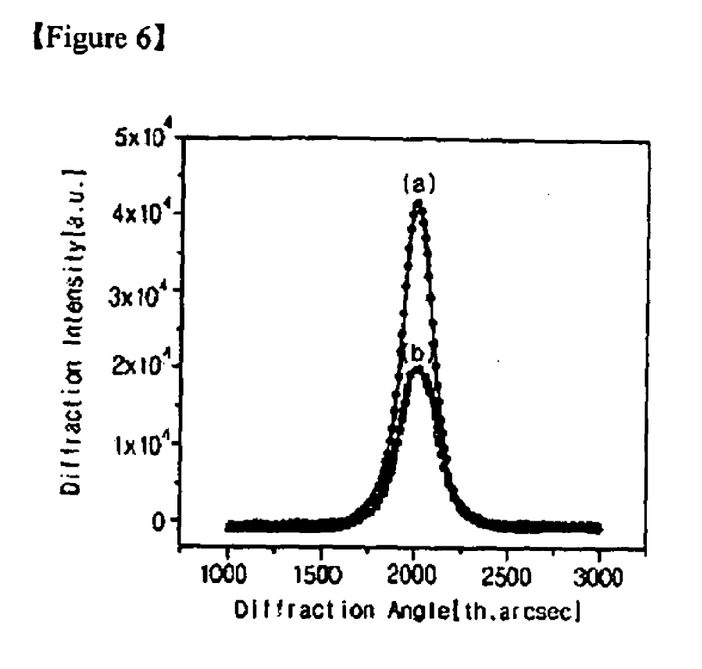
FIG. 6 is a graph showing a result of DC-XRD performed for comparison of the crystallinity on a nitride semiconductor according to an embodiment of the present invention.

FIG. 6 is a graph showing a result of DC-XRD (double crystal X-ray diffraction) performed for comparison of the crystallinity on a nitride semiconductor according to an embodiment of the present invention, in which symbol (a) is the analysis result of the nitride semiconductor according to the present invention and symbol (b) is the analysis result of the nitride semiconductor according to the conventional art.

Referring to FIG. 5, the nitride semiconductor having two or more AlInN layers according to the present invention has the crystallinity of 190 arcsec in the direction of (0002), which corresponds to a value two times or more higher than 250 arcsec that is the crystallinity of the conventional nitride semiconductor. The above result also corresponds with the surface analysis of AFM and the electrical property.

Also, in the nitride semiconductor LED according to the present invention, for example, an ITO electrode/npn-junction LED having a single quantum well structure, electrical properties were measured by a Blue LED chip die not packaged using an integral sphere at a current of 20 mA to obtain the light power of 6.3 mW, the operation voltage of 3.1 V and the core wavelength of 460 nm, which correspond to very excellent values.

As apparent by the above description, the nitride semiconductor LED according to the present invention can suppress the crystal defect of the active layer, enhance the electrical property, increase the light power and enhance the operation reliability.

Second Embodiment

The second embodiment is the same as the first embodiment except that the second AlInN layer is ramp-up grown by linearly varying the growth temperature of the second AlInN layer, for example, from 1000° C. to 1500° C. so as to more effectively control the strains of the first and second AlInN layers.

According to the present embodiment, while the growth temperature increases, the content of indium (In) is linearly decreased, and then the process is converted into a growth mode for an AlN layer having the superior crystallinity. Since the AlN semiconductor is superior in the surface roughness and flatness, it has an advantage that the horizontal growth precedes the vertical growth in the fusion of initial islands of the GaN semiconductor. As a result, the AlN semiconductor is converted into the crystal growth mode in which the horizontal growth precedes the vertical growth to effectively suppress the crystal defect and thus grow a high quality of GaN semiconductor.

Third Embodiment

Figure 7:
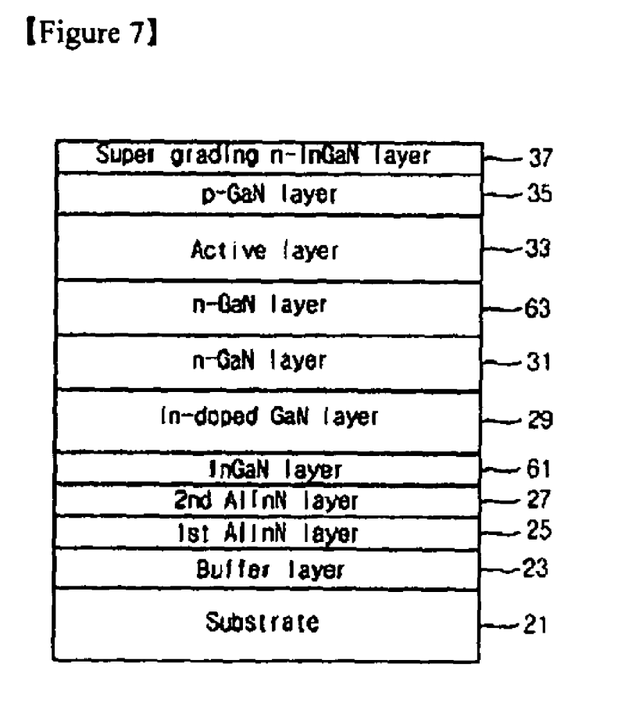
FIG. 7 is a schematic view showing a structure of a nitride semiconductor LED according to a third embodiment of the present invention.

FIG. 7 is a schematic view showing a structure of a nitride semiconductor LED according to a third embodiment of the present invention.

The nitride semiconductor LED shown in FIG. 7 is the same as that of the first embodiment except that it further includes an InGaN layer 61 and an n-InGaN layer 63.

The InGaN layer 61 is disposed between the second AlInN layer 27 and the In-doped GaN layer 29 to further suppress the occurrence of the crystal defect. The n-InGaN layer 63 is disposed between the n-GaN layer 31 and the active layer 33 and is formed in a low-mole $In_xGa_{1-x}N$ layer having a low indium content in order to enhance the internal quantum efficiency of the active layer 33.

Of course, the nitride semiconductor LED of the third embodiment also has two or more AlInN layers 25 and 27 formed on the buffer layer 23.

Fourth Embodiment

In another embodiment according to the spirit of the present invention, a nitride semiconductor LED having a superlattice structure of nitride semiconductor instead of the two or more AlInN layers 25 and 27 grown on the buffer layer 23 is provided. The nitride semiconductor LED according to the fourth embodiment also improves the properties due to the crystal defect.

The superlattice structure of the nitride semiconductor can be formed with one selected from the group consisting of an InGaN/InGaN superlattice structure, an InGaN/GaN superlattice structure, an InGaN/AlGaN superlattice structure, and an InGaN/AlInGaN superlattice structure.

Fifth Embodiment

A nitride semiconductor LED of the fifth embodiment is the same as that of the first embodiment except that the second electrode contact layer has a different structure.

In detail, the nitride semiconductor LEDs shown in FIGS. 1 to 7 employ a super grading n-InGaN layer 37 as the second electrode contact layer of transparent electrode to which a power is applied. The super grading n-InGaN layer 37 has a bandgap controlled by gradually controlling the content of In.

The nitride semiconductor LED of the present embodiment employs a Super OVerlapped structure of p-GaN layer as the second electrode contact layer instead of the super grading n-InGaN layer 37. The Super OVerlapped structure of p-GaN layer (SOV p-GaN layer) represents the p-GaN having the superlattice structure formed by a variation in doping concentration, as shown in FIG. 8.

Figure 8:
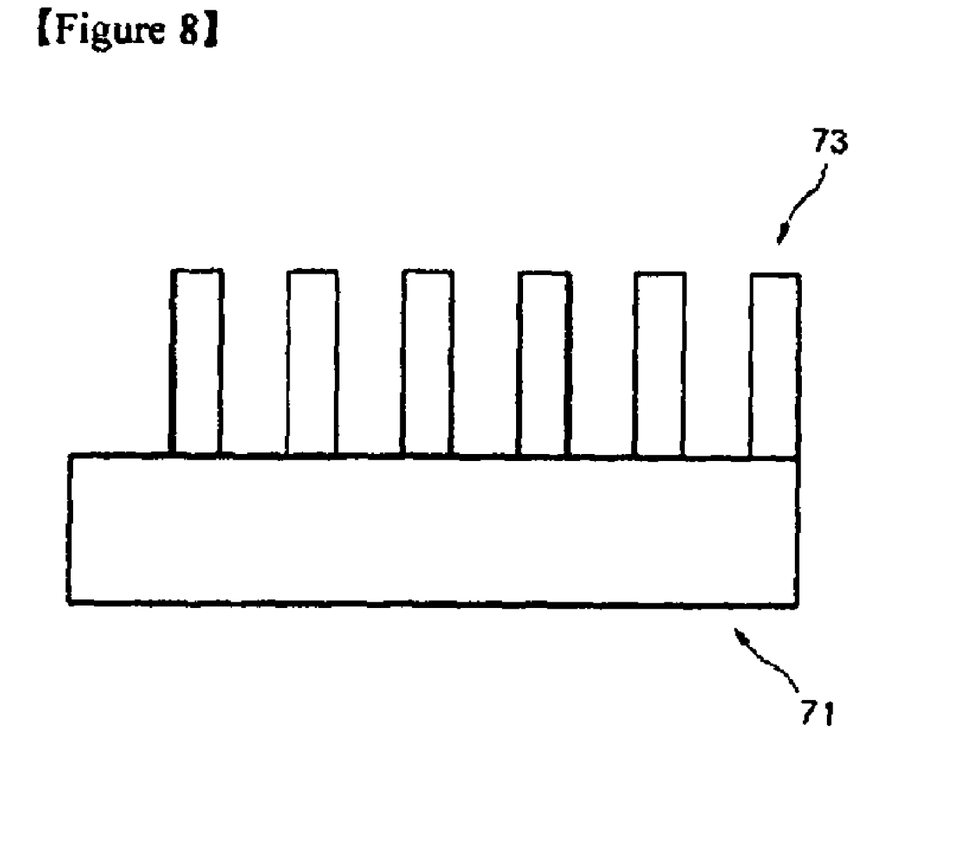
FIG. 8 is a schematic view illustrating a super-overlapped nitride semiconductor structure formed in a nitride semiconductor LEDE according to an embodiment of the present invention.

FIG. 8 is a schematic view illustrating a SOV nitride semiconductor structure formed in a nitride semiconductor LED according to an embodiment of the present invention and describes a variation in bandgap depending the doping concentration of the p-GaN. In FIG. 8, a reference numeral 71 represents the bandgap of the p-GaN layer having a low doping concentration and a reference numeral 73 represents the bandgap of the p-GaN layer having a high doping concentration. The SOV p-GaN layer represents a layer having the superlattice structure of the p-GaN layer having the low doping concentration/the p-GaN layer having the high doping concentration. In one example, $Cp_2Mg$ flow of the p-GaN layer having the low doping concentration can be grown under the condition of $0 \leqq X \leqq 1000$ μmol(where X is the content of Mg), and $Cp_2Mg$ flow of the p-GaN layer having the high doping concentration can be grown under the condition of $50 \leqq X \leqq 10000$ μmol(where X is the content of Mg).

Accordingly, P-GaN carrier concentration can be increased and a transparent electrode, for example, ITO, IZO or the like, can be applied on the SOV p-GaN layer.

As described above, in the nitride semiconductor LED and fabrication method thereof according to the present invention, the crystallinity of the active layer constituting the nitride semiconductor LED can be enhanced and the light power and reliability of the LED can be enhanced.

EXPERIMENTAL EXAMPLE

According to the spirit of the present invention, the performance of the single quantum well LED having the structure of ITO/n-InGaN layer/p-GaN layer/(InGaN/InGaN)SQW layer/$n^+$-GaN(Si-In) layer/GaN(In) layer/(second AlInN layer/first AlInN layer)/(GaN/AlInN/GaN/AlInN)buffer layer/sapphire substrate was tested to obtain the following results. Herein, the $n^+$-GaN(Si-In) layer is the first electrode contact layer, and the n-InGaN layer is the second electrode contact layer.

At the current of 20 mA, electrical performances, for example, the core wavelength of 460 nm, the light power of 6.3 mW, the operation voltage (VF) of 3.1 V were obtained. In the human body mode, the ESD value is at least −1 KV, of which 90% or more can be attained on the entire of a 2-inch sapphire substrate. Herein, the measurement values were measured using a blue LED chip die and especially the light power was measured using an integral sphere.

Mode For Invention

Although the nitride semiconductor LEDs according to the above embodiments show and describe examples having only the two AlInN layers of the first AlInN layer 25 and the second AlInN layer 27, the present invention is not limited thereto. In other words, in another embodiments of the present invention, although three or more AlInN layers can be employed to, the same or improved effect may be obtained.

INDUSTRIAL APPLICABILITY

According to the present invention, the crystallinity of the active layer constituting the nitride semiconductor LED can be improved, and the light power and the reliability can be enhanced. Also, the yield of the nitride semiconductor LED can be increased and the electrical properties can be improved.

The invention claimed is:
1. A nitride semiconductor light emitting device comprising:
   a buffer layer
   an AlInN layer on the buffer layer;
   an InGaN layer on the AlInN layer;
   an In doped GaN layer on the InGaN layer;
   a first semiconductor layer on the In doped GaN layer;
   an active layer formed on the first semiconductor layer;
   a second semiconductor layer formed on the active layer; and
   a third semiconductor layer formed on the second semiconductor layer,
   wherein the third semiconductor layer comprises a superlattice structure due to a difference in doping concentration, wherein the buffer layer comprises a stack structure of AlInN/GaN/AlInN/GaN or $Al_xIn_yGa_{1-x-y}N/In_zGa_{1-z}N/GaN$.

2. The nitride semiconductor light emitting device according to claim 1, wherein the AlInN layer is at least two AlInN layers, wherein each layer constituting the AlInN layers is grown at different temperatures.

3. The nitride semiconductor light emitting device according to claim 1, wherein the AlInN layer is at least two AlInN layers, wherein each layer constituting the AlInN layers is grown such that the content of In linearly decreases.

4. The nitride semiconductor light emitting device according to claim 1, wherein the AlInN layer is at least two AlInN layers, wherein each layer constituting the AlInN layers is grown such that the content of In linearly decreases and the uppermost layer of the AlInN layers is AlN.

5. The nitride semiconductor light emitting device according to claim 1, wherein the AlInN layer comprises a first lower AlInN layer and a second upper AlInN layer.

6. The nitride semiconductor light emitting device according to claim 1, comprising an n-InGaN layer formed on the first semiconductor layer.

7. The nitride semiconductor light emitting device according to claim 1, comprising a first electrode contact layer on the first semiconductor layer,
wherein the first electrode contact layer is an n-type semiconductor layer.

8. The nitride semiconductor light emitting device according to claim 1, comprising a first electrode contact layer on the first semiconductor layer,
wherein the first electrode contact layer is a nitride semiconductor layer co-doped with Si and In.

9. The nitride semiconductor light emitting device according to claim 1, wherein the third semiconductor layer comprises a second electrode contact layer formed on the second semiconductor layer.

10. The nitride semiconductor light emitting device according to claim 9, wherein the second electrode contact layer is a super overlapped structure of a P-GaN layer having the superlattice structure.

11. The nitride semiconductor light emitting device according to claim 9, comprising an electrode layer formed on the second electrode contact layer.

12. The nitride semiconductor light emitting device according to claim 11, wherein the electrode layer is formed of:
a light transmittance oxide comprising ITO(In-SnO), IZO (In-ZnO), ZGO(Ga-ZnO), AZO(Al-ZnO), IGZO(In-GaZnO), AGZO(Al-Ga ZnO), ZnO, IrOx, or RuOx, or
a light transmittance metal of an Au alloy containing Ni metal.

13. A method of fabricating a nitride semiconductor light emitting device, the method comprising:
forming a buffer layer;
forming an AlInN layer on the buffer layer;
forming an InGaN layer on the AlInN layer;
forming an In doped GaN layer on the InGaN layer;
forming a first semiconductor layer on the In doped GaN layer;
forming an active layer on the first semiconductor layer;
forming a second semiconductor layer on the active layer; and
forming a third semiconductor layer on the second semiconductor layer,
wherein the third semiconductor layer comprises a superlattice structure due to a difference in doping concentration,
wherein the buffer layer comprises a stack structure of AlInN/GaN/AlInN/GaN or $Al_xIn_yGa_{1-x-y}N/In_zGa_{1-z}N/GaN$.

14. The method according to claim 13, wherein the AlInN layer is at least two AlInN layers, wherein each layer constituting the AlInN layers is grown such that the growth temperature is varied every step.

15. The method according to claim 13, wherein the AlInN layer is at least two AlInN layers, wherein each layer constituting the AlInN layers is grown such that the content of In linearly decreases.

16. The method according to claim 13, wherein the AlInN layer is at least two AlInN layers, wherein the AlInN layers are provided in a dual-layered structure of which the upper layer is grown in ramp-up.

17. The method according to claim 13, wherein the AlInN layer is at least two AlInN layers, wherein the uppermost layer of the AlInN layers is formed of an AlN layer.

18. The method according to claim 13, wherein forming the third semiconductor layer comprises forming a second electrode contact layer on the second semiconductor layer.

19. The method according to claim 18, further comprising forming an electrode on the second electrode contact layer, wherein the electrode is formed of:
a light transmittance oxide comprising ITO(In-SnO), IZO (In-ZnO), ZGO(Ga-ZnO), AZO(Al-ZnO), IGZO(In-Ga ZnO), AGZO(Al-Ga ZnO), ZnO, IrOx, or RuOx, or
a light transmittance metal of Au alloy containing Ni metal on the second electrode contact layer.

20. A nitride semiconductor light emitting device comprising:
a buffer layer;
a strain control layer provided in at least two AlInN layers on the buffer layer;
an InGaN layer on the strain control layer;
an In doped GaN layer on the InGaN layer;
a first electrode contact layer formed on the In doped GaN layer;
an active layer formed on the first electrode contact layer;
a p-type nitride semiconductor layer formed on the active layer; and
a second electrode contact layer formed on the p-type nitride semiconductor layer,
wherein the second electrode contact layer comprises a superlattice structure due to a difference in doping concentration,
wherein the buffer layer comprises a stack structure of AlltiN/GaN/AlInN/GaN or $Al_xIn_yGa_{1-x-y}N/In_zGa_{1-z}N/GaN$.

21. The nitride semiconductor light emitting device according to claim 20, wherein the second electrode contact layer comprises a super overlapped structure of P-GaN layer having the superlattice structure.

22. The nitride semiconductor light emitting device according to claim 1, wherein the first semiconductor layer comprises a first electrode contact layer.

23. The nitride semiconductor light emitting device according to claim 1, wherein the first semiconductor layer comprises at least one of GaN and InGaN.

24. The method according to claim 13, wherein the first semiconductor layer comprises at least one of GaN and InGaN.

25. The nitride semiconductor light emitting device according to claim 20, wherein the nitride semiconductor layer comprises at least one of GaN and InGaN.

26. The nitride semiconductor light emitting device according to claim 1, wherein the third semiconductor layer comprises a Super Overlapped structure of a p-GaN layer,
wherein the Super Overlapped structure of the p-GaN layer comprises a first p-GaN layer having a low doping concentration and a second p-GaN layer having a high doping concentration.

27. The nitride semiconductor light emitting device according to claim 13, wherein the third semiconductor layer comprises a Super Overlapped structure of a p-GaN layer,
wherein the Super Overlapped structure of the p-GaN layer comprises a first p-GaN layer having a low doping concentration and a second p-GaN layer having a high doping concentration.

28. The nitride semiconductor light emitting device according to claim 20, wherein the second semiconductor layer comprises a Super Overlapped structure of a p-GaN layer,
wherein the Super Overlapped structure of the p-GaN layer comprises a first p-GaN layer having a low doping concentration and a second p-GaN layer having a high doping concentration.

* * * * *